(12) United States Patent
Akizuki et al.

(10) Patent No.: US 7,515,080 B2
(45) Date of Patent: Apr. 7, 2009

(54) A/D CONVERTER

(75) Inventors: Taiji Akizuki, Miyagi (JP); Tomoaki Maeda, Hiroshima (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/898,644

(22) Filed: Sep. 13, 2007

(65) Prior Publication Data

US 2008/0068246 A1 Mar. 20, 2008

(30) Foreign Application Priority Data

Sep. 13, 2006 (JP) .............................. 2006-248364

(51) Int. Cl.
*H03M 3/00* (2006.01)

(52) U.S. Cl. ...................... 341/143; 341/155

(58) Field of Classification Search ................ 341/118, 341/143, 144, 155, 120

See application file for complete search history.

(56) References Cited

U.S. PATENT DOCUMENTS

| 5,153,593 | A | | 10/1992 | Walden et al. | |
| 5,461,381 | A | * | 10/1995 | Seaberg | 341/143 |
| 6,040,793 | A | * | 3/2000 | Ferguson et al. | 341/143 |
| 7,129,875 | B1 | * | 10/2006 | Altun et al. | 341/143 |

FOREIGN PATENT DOCUMENTS

| JP | 5-152967 | 6/1993 |
| JP | 2005-72632 | 3/2005 |

OTHER PUBLICATIONS

Koh, J., "A 66dB DR 1.2V 1.2mW Single-Amplifier Double-Sampling $2^{nd}$-order $\Delta \Sigma$ ADC for WCDMA in 90nm CMOS", ISSCC 2005, Session 9/9.3, IEEE.

* cited by examiner

*Primary Examiner*—Brian Young
(74) *Attorney, Agent, or Firm*—McDermott Will & Emery LLP

(57) ABSTRACT

An A/D converter includes a first switched capacitor block that charges and holds charges by connecting each of a first group of capacitors to a single basic reference voltage at a first timing, and discharges each of the charges held by the first group of capacitors at a second timing, a second switched capacitor block that charges and holds each of the charges discharged by the first group of capacitors respectively in the second group of capacitors at the second timing, and converts each of the charges held by the second group of capacitors to a voltage and outputs the voltages at the first timing, and a quantizer that quantizes an analog input signal using the plurality of voltages output from the second switched capacitor block as reference voltages for each level. A plurality of reference voltages is generated from a single basic reference voltage, based on different amounts of charges held in the plurality of capacitors. A high SNR is obtained by supplying the reference voltages of a quantizer in a multi-bit A/D converter with high accuracy, and low power consumption operation is possible with simplified circuitry.

24 Claims, 10 Drawing Sheets

A/D CONVERTER

BACKGROUND OF THE INVENTION

1. Field of the Invention

The present invention relates to an analog-to-digital (A/D) converter having an improved reference voltage generation unit for generating reference voltages that is, for example, particularly suited to a multi-bit delta-sigma A/D converter used in wireless receivers requiring a high signal-to-noise ratio (SNR).

2. Description of Related Art

While the present invention can be adapted to a common discrete-time A/D converter, the case of a delta-sigma A/D converter will be described below as an example.

Converting analog signals to digital signals facilitates signal transmission and processing and improves efficiency. Accordingly, A/D converters perform an important function in wireless receivers used in mobile telephones and the like. An increase in data rates following the recent implementation of broadband in communication systems has also made it necessary to realize wideband and high SNRs as well as low power consumption in A/D converters. This has led to the use of delta-sigma A/D converters, originally used in measuring instruments and the like, with respect to which high SNRs are readily realized.

Generally, a delta-sigma A/D converter having higher-order filter characteristics is used to realize a high SNR. Since closed loop gain in the feedback loop configuration of a delta-sigma A/D converter increases with higher-order filter characteristics, adversely affecting stability, stability is ensured by using a multi-bit configuration to suppress the amount of instantaneous fluctuation. A multi-bit configuration is effective with high SNRS, since quantization noise can be reduced.

FIG. 9 is a block diagram showing an exemplary conventional n-th order delta-sigma A/D converter. This n-th order delta-sigma A/D converter has a closed loop configuration composed of an n-th order integrator 30, a quantizer 31, and a digital-to-analog (D/A) converter 32. The n-th order integrator 30 is composed of integrators 33[0] to 33[n], subtractors 34[0] to 34[n], input circuits 35[0] to 35[n], and feedback circuits 36[0] to 36[n]. The digital output of the quantizer 31 is converted to an analog value by the D/A converter 32, and supplied to the subtractors 34[0] to 34[n] via the feedback circuits 36[0] to 36[n]. The differences between the output signals of the input circuits 35[0] to 35[n] and the output signals of the feedback circuits 36[0] to 36[n] are obtained by the subtractors 34[0] to 34[n], and the output signals therefrom are input respectively to the integrators 33[0] to 33[n].

With the configuration in FIG. 9, reference voltages of the quantizer 31 are supplied using a reference voltage generation unit 37 having a configuration such as shown in FIG. 10, for example, in order to realize a multi-bit configuration. If the maximum input voltage range of the quantizer 31 is assumed to be ±VFS, an m-bit quantizer requires $2^m-1$ decision values, with the voltage interval of the decision values being $2 \times VFS/(2^m-1)$. Increasing the bit count of the multi-bit configuration twofold in order to improve stability and the SNR therefore means that the intervals between the decision values need to be narrowed by substantially half each. This leads to an increase in the decision error rate due to dispersion in the decision values, making it impossible to maintain high conversion accuracy (linearity).

Since the dispersion accuracy of the resistors is generally significant at around 5%, particularly in the case where the reference voltages are generated by voltage division using resistors $R_1$ to $R_{m+1}$ connected in series, as shown in FIG. 11, high conversion accuracy cannot be maintained, resulting in an increase in quantization error.

For example, assume that the VFS is ±0.25V, and 3-bit decision values are $(\pm 6/7, \pm 4/7, \pm 2/7, 0) \times VFS$. In this case, the decision value dispersion of the higher decision values will be $6/7 \times VFS \times 5\% = 0.02V$, with respect to a decision value interval of $2/7 \times VFS = 0.07V$, meaning that the decision values vary across approximately one third of the decision value interval. Further, with 5-bit decision values, the decision value interval will be 0.016V, resulting in the quantizer not operating properly because of the decision value dispersion being greater than the decision value interval.

This shows that in order to maintain high conversion accuracy (linearity) and increase the bit count of a multi-bit configuration, it is important to reduce dispersion in decision values as much as possible.

Methods proposed to solve this problem involve correcting the multi-bit decision values to obtain high conversion accuracy (linearity) (e.g., see FIG. 1 of JP 5-152967A).

FIG. 12 is a block diagram showing the outline of a delta-sigma A/D converter having a configuration for correcting multi-bit decision values. Two delta-sigma A/D converters 40a and 40b are used, each of which is respectively composed of subtractors 41a and 41b, integrators 42a and 42b, quantizers 43a and 43b and D/A converters 44a and 44b. A signal obtained by subtracting the output signal of the integrator 42a of the delta-sigma A/D converter 40a from an analog input signal with a subtractor 45 is supplied to the subtractor 41b of the other delta-sigma A/D converters 40b. The quantization error signal produced by the quantizer 43a of the delta-sigma A/D converter 40a is thereby measured by the other delta-sigma A/D converter 40b. The quantization error signal can be reduced by generating a correction signal based on this measurement result so as to cancel the quantization error signal, and adding the generated correction signal with an adder 46 on the output side.

However, with the delta-sigma A/D converter shown in FIG. 12, a high precision delta-sigma A/D converter needs to be added as a correction circuit, increasing the circuitry size and making an increase in power consumption inevitable.

SUMMARY OF THE INVENTION

Accordingly, an object of the present invention is to provide an A/D converter that realizes a high SNR by supplying the reference voltages of a quantizer in an A/D converter with high accuracy, and that is capable of low power consumption operation with simplified circuitry.

To solve the above problem, an A/D converter having a first configuration of the present invention includes a single basic reference voltage, a first switched capacitor block that has a first group of capacitors composed of a plurality of capacitors respectively connectable to the basic reference voltage, and that charges and holds charges by connecting each of the first group of capacitors to the basic reference voltage at a first timing, and discharges each of the charges held by the first group of capacitors at a subsequent second timing, a second switched capacitor block that has a second group of capacitors composed of a plurality of capacitors each connectable to the first group of capacitors, and that, at the second timing, charges and holds each of the charges discharged by the first group of capacitors respectively in the second group of capacitors, and, at the first timing, converts each of the charges held by the second group of capacitors to a voltage and outputs the voltages, and a quantizer that quantizes an analog input signal using the plurality of voltages output from the second switched capacitor block as reference voltages for each level. A plurality of the reference voltages is generated from the single basic reference voltage, based on different amounts of charges held in the plurality of capacitors.

An A/D converter having a second configuration of the present invention includes a single basic reference voltage, a first switched capacitor block having a first group of capacitors composed of a plurality of capacitors respectively connectable to the basic reference voltage, a second switched capacitor block having a second group of capacitors composed of a plurality of capacitors each connectable between the first group of capacitors and ground, and a quantizer supplied with a voltage of a connection node of each of the first and second groups of capacitors, and that quantizes an analog input signal with the voltages as reference voltages for each level. Charges held by the plurality of capacitors are discharged at a first timing, and, at a subsequent second timing, charges are charged and held in series circuitry of the first and second groups of capacitors by connecting the basic reference voltage to the first group of capacitors, and a plurality of the reference voltages are generated from the single basic reference voltage, based on different amounts of charges held in the plurality of capacitors.

An A/D converter having a third configuration of the present invention includes an integrator that integrates a signal related to an analog input signal, a single basic reference voltage, a first switched capacitor block that has a first group of capacitors composed of a plurality of capacitors respectively connectable to the basic reference voltage, and that charges and holds charges by connecting each of the first group of capacitors to the basic reference voltage at a first timing, and discharges each of the charges held by the first group of capacitors at a subsequent second timing, and a second switched capacitor block that has a second group of capacitors composed of a plurality of capacitors each connectable to the first group of capacitors, and that, at the second timing, charges and holds each of the charges discharged by the first group of capacitors respectively in the second group of capacitors, and, at the first timing, converts each of the charges held by the second group of capacitors to a voltage to generate reference voltages. A plurality of the reference voltages are generated from the single basic reference voltage, based on different amounts of charges held in the plurality of capacitors, and an output voltage of the integrator is supplied to the second switched capacitor block at the first timing, and a difference voltage between the reference voltages and the output voltage of the integrator is output.

According to the A/D converters of the present invention having the above configurations, dispersion in the reference voltages can be kept to only the amount of dispersion in capacitors with little error, and a high SNR can be achieved by maintaining the high conversion accuracy of the quantizer. Low power consumption can also be achieved since current only flows when charging and discharging charge.

According to the A/D converter having the third configuration, by generating and outputting an output voltage that depends on the difference between the plurality of reference voltages and the output voltage of the integrator with the second switched capacitor block, a simple buffer instead of a quantizer, for example, can be used for this output, enabling simplification of the quantization circuitry to be achieved.

DETAILED DESCRIPTION OF THE INVENTION

Figure 1:
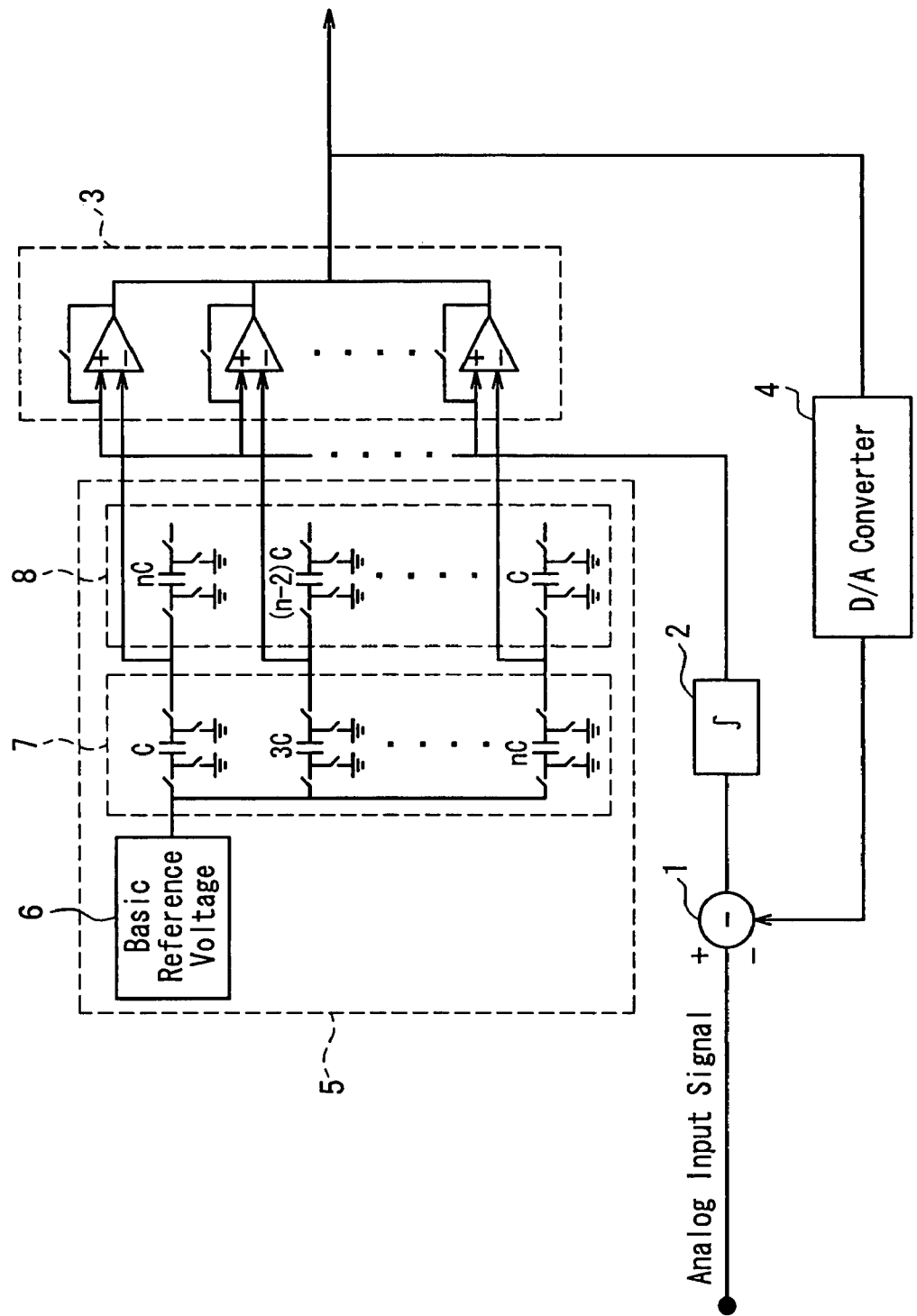
FIG. 1 is a block diagram showing the configuration of a delta-sigma A/D converter according to Embodiment 1 of the present invention.

The present invention is able to adopt various modes such as the following with the above configurations as a basis.

That is, A/D converters of the present invention having the above configurations can be constituted to further include a first switch circuit disposed between the first switched capacitor block and the second switched capacitor block, and capable of switching a combination of connections between the first group of capacitors and the second group of capacitors, a second switch circuit disposed on an output side of the second switched capacitor block, and capable of switching a combination of output positions of signals output from the second group of capacitors, and a switch controller that controls a connection state by the first and second switch circuits, and the switch controller can control switching of the first and second switch circuits with a predetermined method.

An A/D converter having this configuration is able to further reduce noise produced by conversion accuracy (linearity) degradation due to dispersion in the capacitors of the first and second switched capacitor blocks by using the switch controller to implement a noise suppression method such as dynamic element matching (DEM) with respect to the first and second switch circuits.

With the DEM control method given here, in the case where dispersion in the capacitor constants when decision values are always generated with the same capacitors results in conversion accuracy (linearity) degradation depending on the dispersion occurring with the same decision values, dispersion in the capacitor constants is averaged and dispersed over a wide frequency band by using capacitors with a completely random selection method when generating the same decision values, thereby reducing noise within the signal band being used.

This configuration is favorable for noise suppression even if only one of the first and second switch circuits is used, since the quantizer to which the reference voltages are connected is switched.

An A/D converter having any of the foregoing configurations can be constituted such that a switch of the switched capacitor blocks is composed of a MOS transistor, and a dummy switch is provided that is composed of a MOS transistor whose drain terminal and source terminal are connected to an output side of the switch, with a gate area of the dummy switch being half a gate area of the switch, and the dummy switch turning OFF at the same timing as the switch.

This configuration enables errors when generating reference voltages to be reduced, since the discharge of charge from a switch that occurs when the switch turns OFF, commonly known as channel charge injection, can be absorbed with a dummy switch, and the effects of charge on the switched capacitor blocks can be reduced.

Also, the switch composing the switched capacitor blocks preferably is composed of a CMOS transistor. This configuration enables time delays due to a first-order RC filter composed of parasitic capacitance on the switch output and the resistance component of the switch to be improved, since resistance values during switch operation can be decreased, in comparison to when the switch is composed of only an NMOS or a pMOS.

Also, the capacitors composing the switched capacitor blocks preferably are composed of wiring layers and insulators. Capacitors typically composed of wiring layers and insulators include MIMI capacitors and MOM capacitors, with these capacitors enabling errors when generating reference voltages to be reduced, since dispersion in capacitance values can be smaller than that of normal capacitors.

Also, an A/D converter having any of the foregoing configurations can be configured as a delta-sigma A/D converter, with integrator control being performed discretely. This configuration enables power consumption to be reduced in comparison with an integrator that operates continuously, since the integrator does not need to be operated constantly.

Also, an A/D converter having any of the foregoing configurations can be configured as a delta-sigma A/D converter, with the quantizer having a latch comparator configuration. This configuration enables comparison errors such as making decisions when reference voltages have not been input to be prevented, since the quantizer can be operated in synchronization with the output of reference voltages by the reference voltage generation unit. This configuration also enables power consumption to be reduced since the reference voltage generation unit need not operate when decision values are not being output.

Also, an A/D converter having any of the foregoing configurations can be configured as a delta-sigma A/D converter, with a reference voltage generation unit composed of the first and second switched capacitor blocks being used as a reference voltage of the delta-sigma A/D converter.

This configuration enables conversion accuracy (linearity) degradation to be reduced, since an output voltage can be generated by similarly using a reference voltage with little dispersion error for the output voltage of the D/A converter. Also, although SNR degradation occurs due to the influx of noise from the power supply in the case where reference voltages are generated by voltage division using resistors, the reference voltage generation unit enables SNR degradation to be improved due to the use of capacitors, since noise from the power supply is averaged and attenuated when charge is charged in the capacitors.

Embodiment of the present invention will now be described with reference to the drawings.

Embodiment 1

FIG. 1 shows the block diagram of a delta-sigma A/D converter according to Embodiment 1 of the present invention. The delta-sigma A/D converter has a closed loop configuration composed of a subtractor 1, an integrator 2, a quantizer 3, and a digital-to-analog (D/A) converter 4, with decision values of the quantizer 3 being supplied as voltages from a reference voltage generation unit 5.

The reference voltage generation unit 5 is composed of a single basic reference voltage 6, a first switched capacitor block 7 connected to the basic reference voltage 6, and a second switched capacitor block 8 connected to the first switched capacitor block 7.

In the present embodiment, an example is given in which the first and second switched capacitor blocks 7 and 8 are composed of switched capacitor circuits in a discrete delta-sigma A/D converter. If the sampling clock of the discrete delta-sigma A/D converter in FIG. 1 is assumed to be Ts, the switched capacitors repeatedly turn ON/OFF at Ts/2 intervals, and are controlled by clocks $\phi 1$ and $\phi 2$ that are not ON at the same time.

The first switched capacitor block 7 includes a first group of capacitors composed of two or more capacitors C, 3C, ..., nC, and charges and holds charges by connecting the capacitors to the basic reference voltage 6 at a first timing, and discharges the charges held in the capacitors at a subsequent second timing. The second switched capacitor block 8 includes a second group of capacitors composed of two or more capacitors nC, (n−2)C, ..., C that correspond respectively to the first group of capacitors C, 3C, ..., nC. The second switched capacitor block 8, at the second timing, charges and holds the charges discharged by the capacitors of the first switched capacitor block 7, and, at the first timing, converts the charges held by the capacitors to voltages and outputs the voltages to the quantizer 3.

Figure 2:
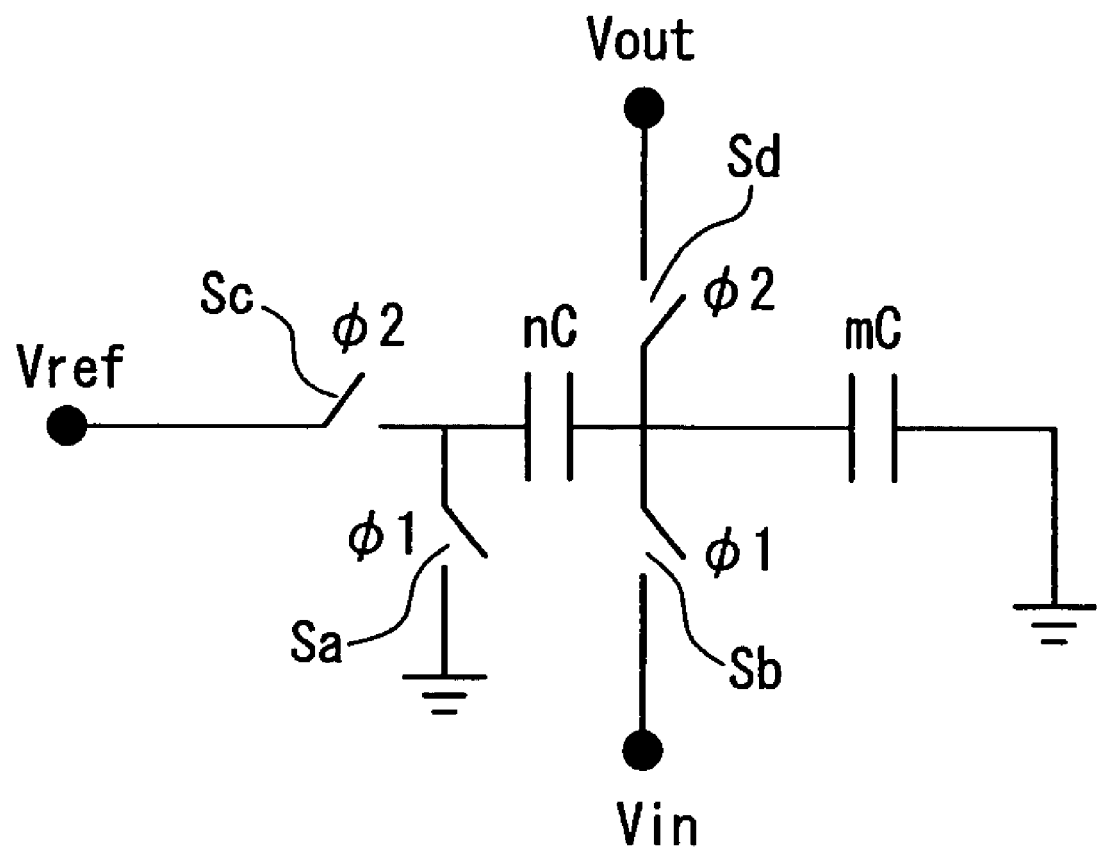
FIG. 2 is a circuit diagram showing an exemplary configuration of a switched capacitor used in the delta-sigma A/D converter.

Decision voltages can be generated in the first and second switched capacitor blocks 7 and 8 by, for example, using a plurality of switched capacitor circuits such as shown in FIG. 2 of the same number as the required number of reference voltages. Operations for composing a single reference voltage will now be described with reference to the example in FIG. 2.

In FIG. 2, the capacitance values of capacitors nC and mC are respectively n and m (n, m being integers) multiples of a reference capacitance value C. Switches Sa and Sb conduct at the clock timing $\phi 1$, while switches Sc and Sd conduct at the clock timing $\phi 2$. Consequently, at the clock timing $\phi 1$, both terminals of the capacitors nC and mC are connected to the same voltage level Vin and charges Q stored in the capacitors are reset. Next, at the clock timing $\phi 2$, the capacitors nC and mC are connected in series and one end of the capacitor nC is connected to the basic reference voltage Vref, thereby outputting a reference voltage that depend on the capacitance ratio being used as Vout=Vref×n/(m+n).

Therefore, in the case where 2-bit reference voltages (⅙× Vref, ⅜×Vref, ⅝×Vref) are required, for example, the required reference voltages can be generated by setting the capacitance values of the capacitors nC and mC to the rates shown in Table 1 below.

TABLE 1

|   | ⅙ × Vref | ³⁄₆ × Vref | ⅚ × Vref |
|---|---|---|---|
| n | 1 | 3 | 5 |
| m | 5 | 3 | 1 |

Further, decision values corresponding to n-th order multibits can be arbitrarily set by similarly setting the capacitor values.

Figure 11:
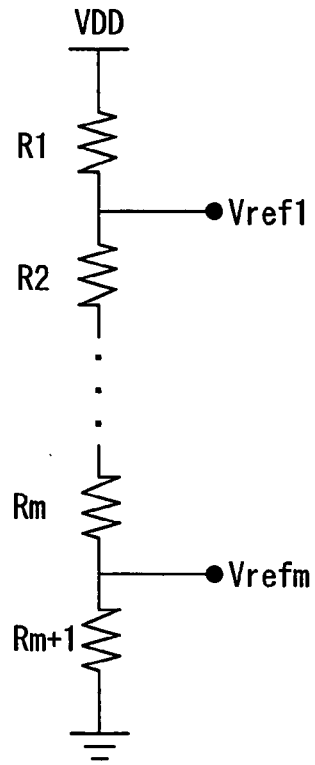
FIG. 11 is a circuit diagram showing exemplary circuitry for generating conventional reference voltages.
Figure 12:
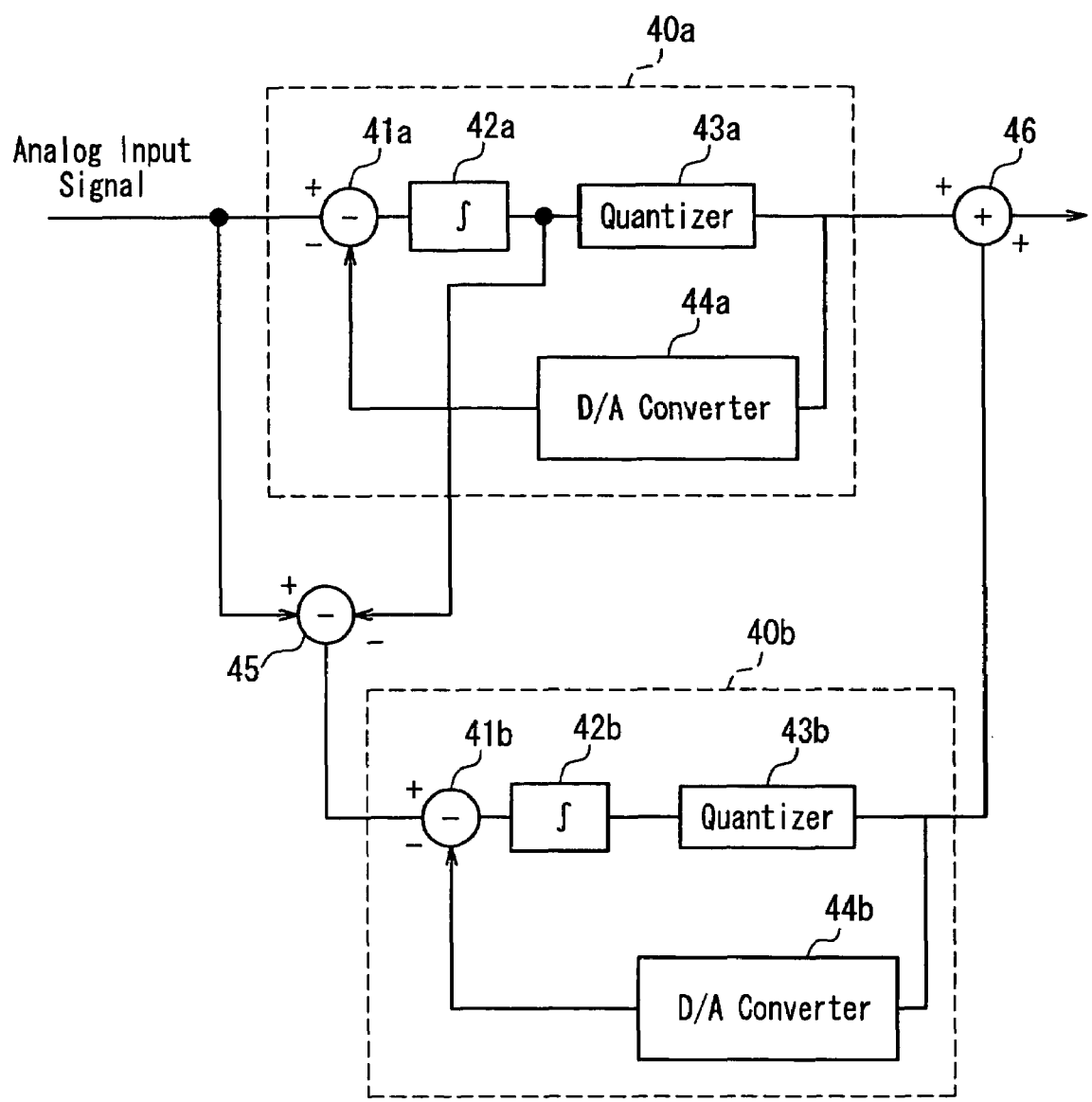
FIG. 12 is a block diagram showing a conventional delta-sigma A/D converter having a configuration for correcting dispersion in decision values.

The configuration of the present embodiment enables reference voltages corresponding to multi-bits to be generated with capacitors having little dispersion in rated capacitances. That is, since dispersion in the capacitance values of the capacitors is generally around 0.5%, the amount of dispersion in decision values can be improved $\frac{1}{10}$-fold, in comparison with the case in FIG. 11 where the circuitry is composed of resistors.

Embodiment 2

Figure 3:
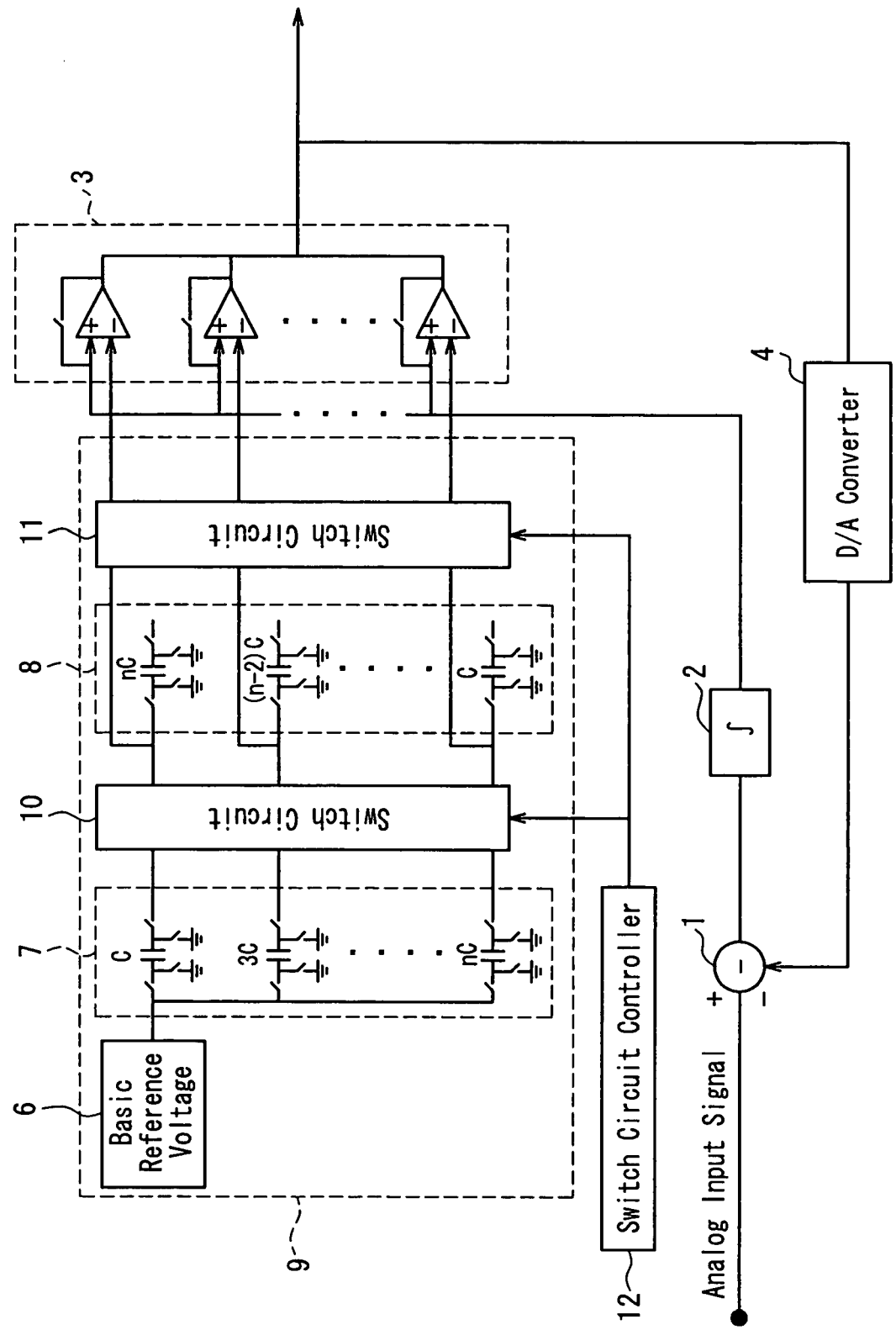
FIG. 3 is a block diagram showing the configuration of a delta-sigma A/D converter according to Embodiment 2 of the present invention.

FIG. 3 shows the block diagram of a delta-sigma A/D converter according to Embodiment 2 of the present invention. In FIG. 3, the same reference numerals are attached to elements that are the same as FIG. 1, and description thereof will not be repeated.

In this delta-sigma A/D converter, the configuration of a reference voltage generation unit 9 differs from Embodiment 1. That is, switch circuits 10 and 11 are provided on the output side of the first and second switched capacitor blocks 7 and 8, and the ON/OFF control of these circuits is performed by a switch circuit controller 12.

In Embodiment 1, the reference voltages generated by the reference voltage generation unit 5 are set according to combinations of capacitance values predetermined by the two capacitors mC and nC. Therefore, if the capacitance values vary, errors in proportion to the dispersion in the reference voltages always occur with respect to the same reference voltages, and degradation of the conversion accuracy (linearity) of the quantizer 3 is fixed.

With the configuration of Embodiment 2, on the other hand, the switch circuits 10 and 11 are controlled by the switch circuit controller 12, enabling the combination of capacitors in the first and second switched capacitor blocks 7 and 8 to be selected. Consequently, the capacitances of the two capacitors mC and nC for generating decision values can be expressed as capacitance values obtained by connecting a plurality of arbitrary capacitors in parallel.

That is, by causing the switch circuit controller 12 to perform the switching control completely randomly, such has with dynamic element matching (DEM), for example, the same capacitors are not constantly used to generate the same reference voltages. Thus, even if the capacitance values disperse, reference voltage error due to this dispersion is reduced, enabling degradation of the conversion accuracy (linearity) of the quantizer 3 to be suppressed.

Note that even if only one of the switch circuits 10 and 11 is switched, conversion accuracy (linearity) degradation due to dispersion in the capacitance values can be improved.

Embodiment 3

Figure 4:
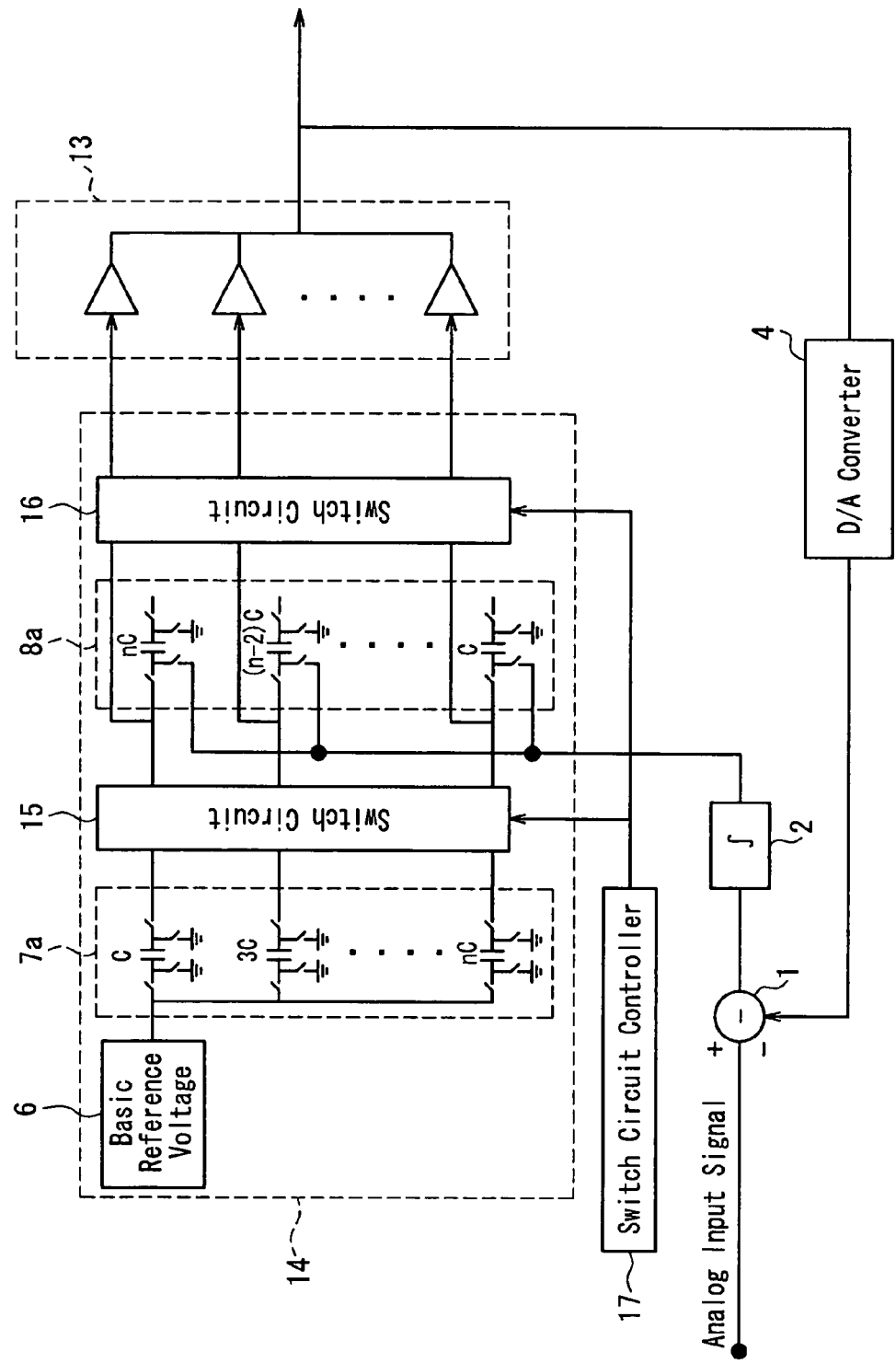
FIG. 4 is a block diagram showing the configuration of a delta-sigma A/D converter according to Embodiment 3 of the present invention.

FIG. 4 shows the block diagram of a delta-sigma A/D converter according to Embodiment 3 of the present invention. In FIG. 4, the same reference numerals are attached to elements that are the same as FIG. 1, and description thereof will not be repeated.

In this delta-sigma A/D converter, the configuration of a reference voltage generation unit 14 differs from Embodiments 1 and 2. That is, the reference voltage generation unit 14 inputs the output of the integrator 2 and a switched capacitor block 7a to a switched capacitor block 8a, and outputs an output voltage of the difference thereof. Consequently, a buffer 13 is used instead of the quantizer 3 of Embodiments 1 and 2. The switching control of switch circuits 15 and 16 for outputting the output voltage of the difference is performed by a switch circuit controller 17.

Figure 5:
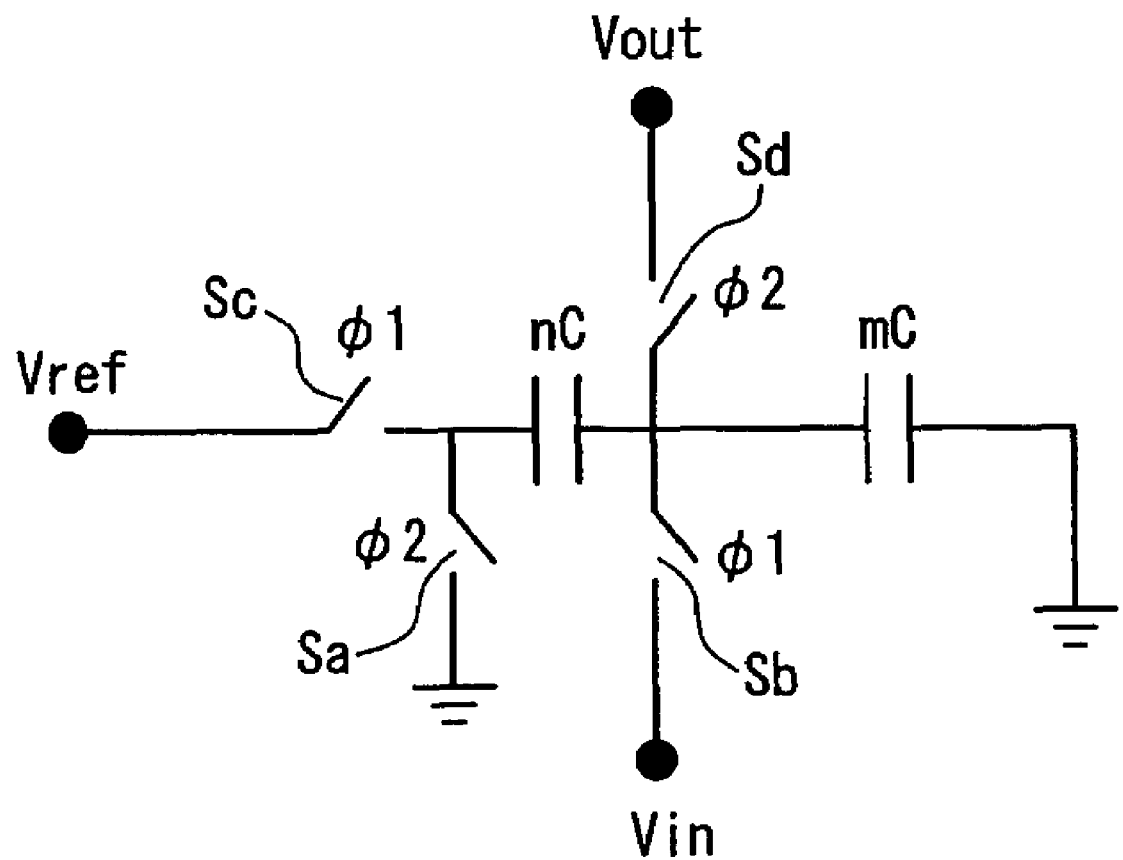
FIG. 5 is a circuit diagram showing an exemplary configuration of a switched capacitor used in the delta-sigma A/D converter.

To compare the quantizer input voltages and the reference voltages, and output difference voltages thereof with the reference voltage generation unit 14, a plurality of switched capacitor circuits such as shown in FIG. 5 of the same number as the required number of reference voltages preferably is used.

The switched capacitor circuit shown in FIG. 5 has a configuration in which a voltage Vin is input between two capacitors nC and mC via a switch Sb. Switches Sb and Sc conduct during the high period of the clock timing φ1, and switches Sa and Sd conduct during the high period of the clock timing φ2.

At the clock timing φ1, the voltage Vin is supplied between the two capacitors nC and mC, and the other end of the capacitor nC is connected to the basic reference voltage Vref. The reference voltage is output as Vout=Vin−Vref×n/(n+m), since charge that depends on the amount of voltage fluctuation (Vref−0) decreases in the capacitor nC in the case where the Vref voltage is switched to a ground potential (0V) at the subsequent clock timing φ2.

The configuration of the present embodiment enables the simple buffer 13, for example, to be used for the output rather than a quantizer, as shown in FIG. 4, by connecting the integrator 2 to one of the switches composing the second switched capacitor block 8a and outputting the output voltage of the integrator 2 as the input voltage Vin, and by outputting the difference with a voltage obtained by converting the charge held by the capacitors as the output voltage Vout. Thus, the circuitry can be simplified.

In the case where two input quantizers are used, a circuit configuration with two input signals in the differential amplifier circuit can be readily constituted, since mutually different quantizer input signals can be input.

The present embodiment as described above is able to achieve both a high SNR by maintaining the high conversion accuracy of the quantizer, and low power consumption, while simplifying the circuit configuration.

Figure 6:
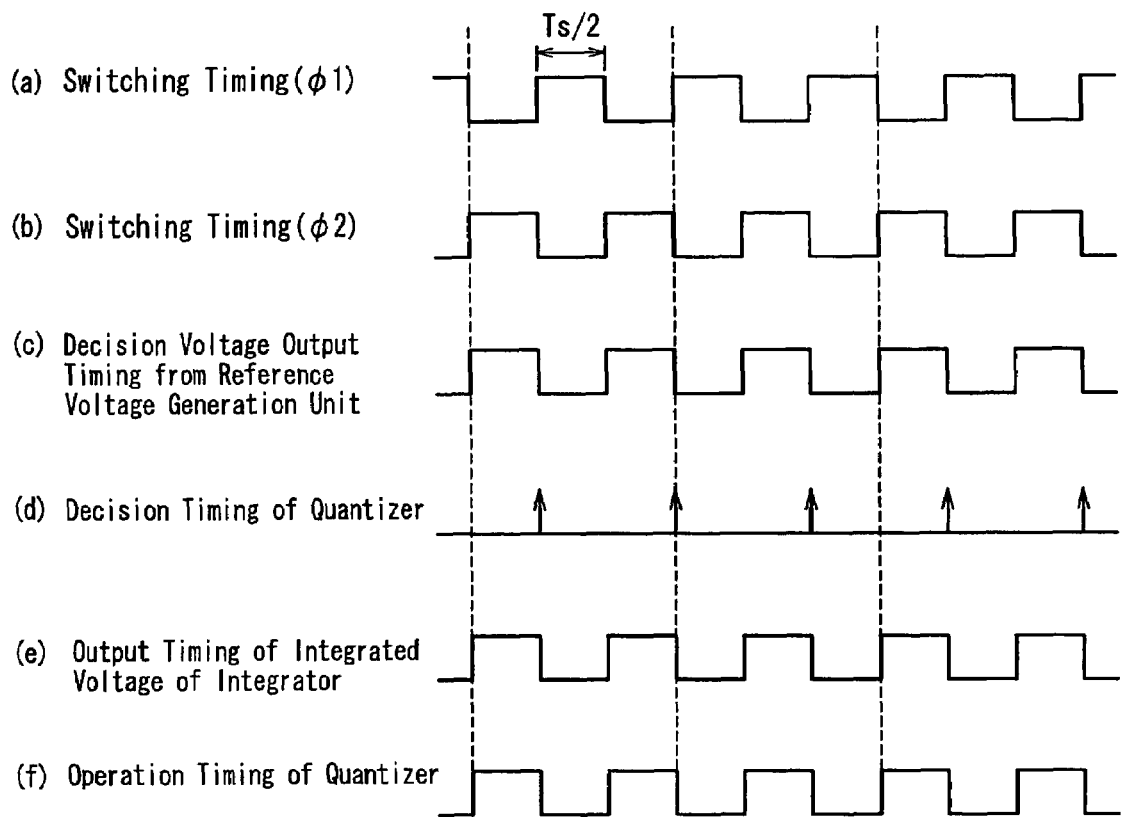
FIG. 6 is a timing chart showing exemplary control signals.

Note that in Embodiments 1 to 3 above, the integrator may be configured to operate discretely. Exemplary operation timings of the blocks are given in FIG. 6. In FIG. 6, (a) and (b) show switch timings φ1 and φ2, (c) shows the output timing of reference voltages from the reference voltage generation unit, (d) shows the decision timing of the quantizer, (e) shows the output timing of integrated voltages from the integrator, and (f) shows the operation timing of the quantizer.

The reference voltage generation unit stores charges at the switch timing φ1 (a), and converts the stored charges to reference voltages and outputs the reference voltages to the quantizer at the switch timing φ2 (c).

When each reference voltage turns OFF, the quantizer compares the reference voltage with the integrator output, and generates output signals (d). In this case, an integrator that operates continuously may be used, but the integrator output need only be output at the decision timing of the quantizer. Consequently, the integrator is only operated at the switch timing φ2, enabling use of an integrator that operates discretely. As a result, the power consumption of an integrator in a delta-sigma A/D converter can be reduced, since the current consumption of an integrator that operates discretely is generally less than an integrator that operates continuously.

In the foregoing embodiments, the quantizer may have a latch comparator configuration. That is, since the decision timing of the quantizer may be when the switch timing φ2 turns OFF, as shown in FIG. 6, the quantizer only operates at the switch timing φ2 (f), enabling a latch comparator that turns OFF at the switch timing φ1 to be used, and current consumption to be reduced.

Also, since the quantizer can be operated in synchronization with the output of reference voltages by the reference voltage generation unit, comparison errors such as making decisions when reference voltages have not been input can be prevented.

Figure 7:
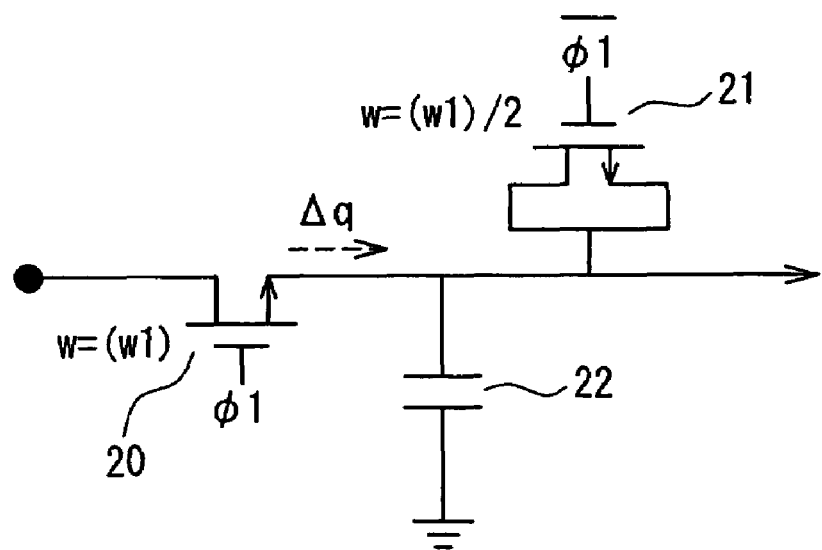
FIG. 7 is a circuit diagram showing an exemplary configuration in which a dummy switch is provided in a switched capacitor block.

In Embodiments 1 to 3 above, the switched capacitor blocks may include a dummy switch. FIG. 7 shows an example in which a dummy switch 21 having an nMOS configuration has been added to the output of an nMOS switch 20. The dummy switch 21 is composed of an nMOS having a gate area half the gate area of the nMOS switch 20, has both the drain and source terminals connected to the output of the nMOS switch 20, and turns on at the timing φ1 similarly to the nMOS switch 20.

In FIG. 7, the nMOS switch 20, when turned OFF at the timing φ1, outputs a charge Δq changed between the terminals to the drain and source terminals. If the dummy switch 21 is not provided, the charge Δq is supplied to the capacitor 22, resulting in an error in the charge amount of the capacitor 22. This error is generally called a channel charge injection.

On the other hand, if the dummy switch 21 turns ON at the same time as the nMOS switch 20 turns OFF at the timing φ1, the dummy switch 21 absorbs respective charges in amount of Δq/2 through both the source and drain terminals, since the absorbed or discharged charge amount of the nMOS switch 20 is in proportion to the gate area.

That is, the charge Δq output from the NMOS switch 20 is absorbed by the nMOS of the dummy switch 21, and charge in not supplied to the capacitor 22. Therefore, errors caused by fluctuation in the charge amount of the capacitor 22 can be improved. Consequently, errors when generating reference voltages can be reduced.

Figure 8:
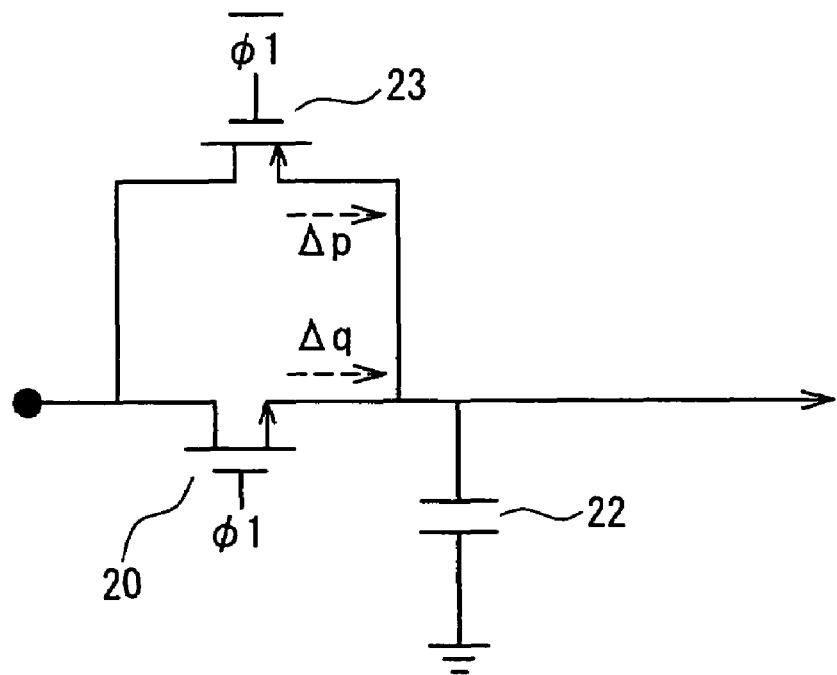
FIG. 8 is a circuit diagram showing an example in which the switch in FIG. 7 has a CMOS configuration.
Figure 9:
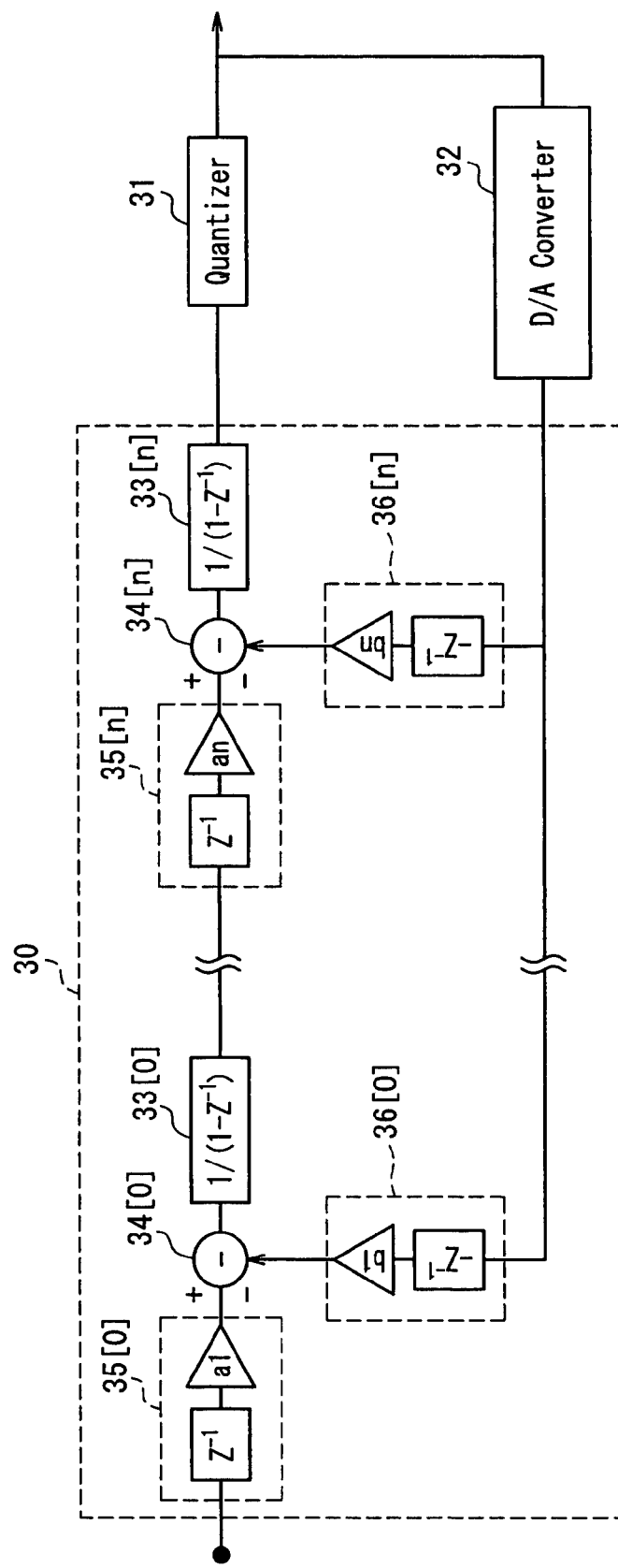
FIG. 9 is a block diagram showing the configuration of a delta-sigma A/D converter of a conventional example 1.
Figure 10:
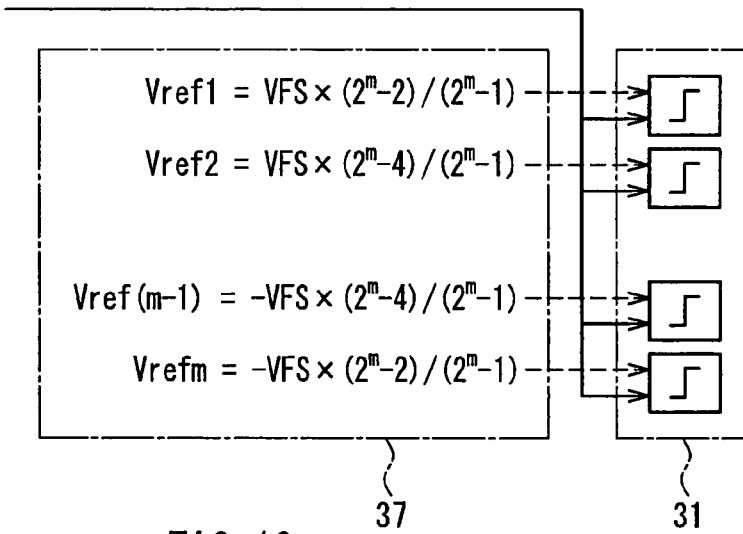
FIG. 10 shows an exemplary configuration of conventional reference voltages.

In Embodiments 1 to 3 above, the switches composing the switched capacitor blocks may have a CMOS configuration. FIG. 8 shows an example where the CMOS is structured by an nMOS switch 20 and a pMOS switch 23. In FIG. 8, a charge Δq held between the terminals is output to the drain and source terminals when the nMOS switch 20 turns OFF at the timing φ1. On the other hand, since a control signal of opposite voltage to the nMOS switch 20 is applied to the pMOS switch 23, the pMOS switch 23 of opposite polarity to the nMOS switch 20 turns OFF at the same time as the nMOS switch 20 turns OFF, and a hole Δp held between the terminals is output to the drain and source terminals.

Here, since the polarities of the charge and hole discharged respectively from the nMOS and the pMOS are opposite, charge is not supplied to the capacitor 22 connected to the output terminal, as a result of adjusting the gate area of each MOS so that their respective charge amounts balance out (Δq=Δp). Therefore, errors caused by fluctuation in the charge amounts of the capacitor 22 can be improved. This enables errors when generating reference voltages to be reduced.

Generally, with CMOS switches, resistance values during switch operation can be decreased in comparison to when switches are composed of only an nMOS or a pMOS, thereby enabling time delays due to a first-order RC filter composed of parasitic capacitance on the switch output and the resistance component of the switch to be improved.

In Embodiment 1 to 3 above, the capacitors composing the switched capacitor blocks preferably are composed of wiring layers and insulators. Capacitors typically composed of wiring layers and insulators include MIM capacitors and MOM capacitors, with these capacitors enabling errors when generating reference voltages to be reduced, since dispersion in capacitance values can be smaller than that of normal capacitors.

In Embodiment 1 to 3, the reference voltage generation units 5 and 9 were only used to generate reference voltages for the quantizer 3, but the reference voltage may also be used as a reference voltage for the D/A converter 4. This enables conversion accuracy (linearity) degradation to be reduced, since an output voltage can be generated by similarly using a reference voltage with little dispersion error for the output voltage of the D/A converter 4.

The D/A converter and delta-sigma A/D converter of the preset invention are useful as D/A converters used in wireless, audio, and other fields.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An A/D converter comprising:
a single basic reference voltage;
a first switched capacitor block that has a first group of capacitors composed of a plurality of capacitors respectively connectable to the basic reference voltage, and that charges and holds charges by connecting each of the first group of capacitors to the basic reference voltage at a first timing, and discharges each of the charges held by the first group of capacitors at a subsequent second timing;
a second switched capacitor block that has a second group of capacitors composed of a plurality of capacitors each connectable to the first group of capacitors, and that, at the second timing, charges and holds each of the charges discharged by the first group of capacitors respectively in the second group of capacitors, and, at the first timing, converts each of the charges held by the second group of capacitors to a voltage and outputs the voltages; and
a quantizer that quantizes an analog input signal using the plurality of voltages output from the second switched capacitor block as reference voltages for each level,
wherein a plurality of the reference voltages are generated from the single basic reference voltage, based on different amounts of charges held in the plurality of capacitors.

2. The A/D converter according to claim 1, comprising:
a first switch circuit disposed between the first switched capacitor block and the second switched capacitor block, and capable of switching a combination of connections between the first group of capacitors and the second group of capacitors;
a second switch circuit disposed on an output side of the second switched capacitor block, and capable of switching a combination of output positions of signals output from the second group of capacitors; and
a switch controller that controls a connection state by the first and second switch circuits, wherein the switch controller controls switching of the first and second switch circuits with a predetermined method.

3. The A/D converter according to claim 1, wherein a switch of the switched capacitor blocks is composed of a MOS transistor, and a dummy switch is provided that is composed of a MOS transistor whose drain terminal and source terminal are connected to an output side of the switch, with a gate area of the dummy switch being half a gate area of the switch, and the dummy switch turning OFF at a same timing as the switch.

4. The A/D converter according to claim 3, wherein the switch composing the switched capacitor blocks is composed of a CMOS transistor.

5. The A/D converter according to claim 1, wherein the capacitors composing the switched capacitor blocks are composed of wiring layers and insulators.

6. The A/D converter according to claim 1, wherein the A/D converter is configured as a delta-sigma A/D converter, and control of an integrator used for composing a delta-sigma A/D converter is performed discretely.

7. The A/D converter according to claim 1, wherein the A/D converter is configured as a delta-sigma A/D converter, and the quantizer has a latch comparator configuration.

8. The A/D converter according to claim 1, wherein the A/D converter is configured as a delta-sigma A/D converter, and uses a reference voltage generation unit composed of the first and second switched capacitor blocks as a reference voltage of the delta-sigma A/D converter.

9. An A/D converter comprising:
a single basic reference voltage;
a first switched capacitor block having a first group of capacitors composed of a plurality of capacitors respectively connectable to the basic reference voltage;
a second switched capacitor block having a second group of capacitors composed of a plurality of capacitors each connectable between the first group of capacitors and ground; and
a quantizer supplied with a voltage of a connection node of each of the first and second groups of capacitors, and that quantizes an analog input signal with the voltages as reference voltages for each level,
wherein charges held by the plurality of capacitors are discharged at a first timing, and, at a subsequent second timing, charges are charged and held in series circuitry of the first and second groups of capacitors by connecting the basic reference voltage to the first group of capacitors, and
a plurality of the reference voltages are generated from the single basic reference voltage, based on different amounts of charges held in the plurality of capacitors.

10. The A/D converter according to claim 9, comprising:
a first switch circuit disposed between the first switched capacitor block and the second switched capacitor block, and capable of switching a combination of connections between the first group of capacitors and the second group of capacitors;
a second switch circuit disposed on an output side of the second switched capacitor block, and capable of switching a combination of output positions of signals output from the second group of capacitors; and
a switch controller that controls a connection state by the first and second switch circuits,
wherein the switch controller controls switching of the first and second switch circuits with a predetermined method.

11. The A/D converter according to claim 9, wherein a switch of the switched capacitor blocks is composed of a MOS transistor, and a dummy switch is provided that is composed of a MOS transistor whose drain terminal and source terminal are connected to an output side of the switch, with a gate area of the dummy switch being half a gate area of the switch, and the dummy switch turning OFF at a same timing as the switch.

12. The A/D converter according to claim 11, wherein the switch composing the switched capacitor blocks is composed of a CMOS transistor.

13. The A/D converter according to claim 9, wherein the capacitors composing the switched capacitor blocks are composed of wiring layers and insulators.

14. The A/D converter according to claim 9, wherein the A/D converter is configured as a delta-sigma A/D converter, and control of an integrator used for composing a delta-sigma A/D converter is performed discretely.

15. The A/D converter according to claim 9, wherein the A/D converter is configured as a delta-sigma A/D converter, and the quantizer has a latch comparator configuration.

16. The A/D converter according to claim 9, wherein the A/D converter is configured as a delta-sigma A/D converter, and uses a reference voltage generation unit composed of the first and second switched capacitor blocks as a reference voltage of the delta-sigma A/D converter.

17. An A/D converter comprising:
an integrator that integrates a signal related to an analog input signal;
a single basic reference voltage;
a first switched capacitor block that has a first group of capacitors composed of a plurality of capacitors respectively connectable to the basic reference voltage, and that charges and holds charges by connecting each of the first group of capacitors to the basic reference voltage at a first timing, and discharges each of the charges held by the first group of capacitors at a subsequent second timing; and
a second switched capacitor block that has a second group of capacitors composed of a plurality of capacitors each connectable to the first group of capacitors, and that, at the second timing, charges and holds each of the charges discharged by the first group of capacitors respectively in the second group of capacitors, and, at the first timing, converts each of the charges held by the second group of capacitors to a voltage to generate reference voltages,
wherein a plurality of the reference voltages are generated from the single basic reference voltage, based on different amounts of charges held in the plurality of capacitors, and
an output voltage of the integrator is supplied to the second switched capacitor block at the first timing, and a difference voltage between the reference voltages and the output voltage of the integrator is output.

18. The A/D converter according to claim 17, comprising:
a first switch circuit disposed between the first switched capacitor block and the second switched capacitor block, and capable of switching a combination of connections between the first group of capacitors and the second group of capacitors;
a second switch circuit disposed on an output side of the second switched capacitor block, and capable of switching a combination of output positions of signals output from the second group of capacitors; and
a switch controller that controls a connection state by the first and second switch circuits, wherein the switch controller controls switching of the first and second switch circuits with a predetermined method.

19. The A/D converter according to claim 17, wherein a switch of the switched capacitor blocks is composed of a MOS transistor, and a dummy switch is provided that is composed of a MOS transistor whose drain terminal and source terminal are connected to an output side of the switch, with a gate area of the dummy switch being half a gate area of the switch, and the dummy switch turning OFF at a same timing as the switch.

20. The A/D converter according to claim 19, wherein the switch composing the switched capacitor blocks is composed of a CMOS transistor.

21. The A/D converter according to claim 17, wherein the capacitors composing the switched capacitor blocks are composed of wiring layers and insulators.

22. The A/D converter according to claim 17, wherein the A/D converter is configured as a delta-sigma A/D converter, and integrator control is performed discretely.

23. The A/D converter according to claim 17, wherein the A/D converter is configured as a delta-sigma A/D converter, and the quantizer has a latch comparator configuration.

24. The A/D converter according to claim 17, wherein the A/D converter is configured as a delta-sigma A/D converter, and uses a reference voltage generation unit composed of the first and second switched capacitor blocks as a reference voltage of the delta-sigma A/D converter.

* * * * *